United States Patent [19]

Kares

[11] Patent Number: 5,479,314
[45] Date of Patent: Dec. 26, 1995

[54] CIRCUIT ARRANGEMENT HAVING A SEMICONDUCTOR SWITCH FOR THE SWITCHING OF A LOAD

[75] Inventor: Walter Kares, Frankfurt, Germany

[73] Assignee: VDO Adolf Schindling AG, Frankfurt am Main, Germany

[21] Appl. No.: 287,049

[22] Filed: Aug. 8, 1994

Related U.S. Application Data

[63] Continuation of Ser. No. 903,793, Jun. 24, 1992, abandoned.

[30] Foreign Application Priority Data

Dec. 21, 1991 [DE] Germany ............................ 41 42 666.5

[51] Int. Cl.⁶ ..................................................... H02H 7/10
[52] U.S. Cl. ................................. 361/18; 361/87
[58] Field of Search ................................. 361/18, 30, 86, 361/87

[56] References Cited

U.S. PATENT DOCUMENTS 4,441,136  4/1984  Hampshire ................................. 361/88
4,979,066  12/1990  Kawata et al. ............................. 361/18

*Primary Examiner*—Todd Deboer
*Attorney, Agent, or Firm*—Martin A. Farber

[57] ABSTRACT

In a circuit arrangement having a semiconductor switch for the switching of a load, in particular of a setting member in manual or automatic control devices, as a function of a switch signal which is fed, a device for disconnect in the event of a short-circuit being adapted to be controlled by a current sensor over a filter, the device for the disconnecting can furthermore be actuated via a logic circuit by the switch signal and by an output signal of a detector for an overvoltage at the semiconductor switch in such a manner that disconnect takes place when an overvoltage is present and the switch signal assumes a level intended for connection.

5 Claims, 1 Drawing Sheet

CIRCUIT ARRANGEMENT HAVING A SEMICONDUCTOR SWITCH FOR THE SWITCHING OF A LOAD

RELATED APPLICATION

This application is a continuation of my co-pending application Ser. No. 07/903,793 filed Jun. 24, 1992, now abandoned.

The present invention relates to a circuit arrangement having a semiconductor switch for the switching of a load, in particular a setting member in manual or automatic control devices, as a function of a switch signal which is fed, means for disconnecting in the event of a short-circuit being adapted to be controlled by a current sensor via a filter.

Such circuit arrangements are used, in particular, when the load is connected by cable to the semiconductor switch, as, for instance, in the engine compartment of an automotive vehicle. Due to the rough operating conditions, a short-circuit here is not out of the question. The controlling of the disconnect device takes place, however, over a filter since brief current peaks should not lead to a disconnect. However, in these circuit arrangements current limiting controllers are provided so that, in the event of a short-circuit, the current is limited until disconnect. In the event of a very rapid increase in current however, the current is first of all limited by the properties of the transistor used as semiconductor switch before the limiting control enters into action.

In the case of an inductive component of the load present in the event of a short-circuit, the reduction in current produced by the controller results in a voltage peak which may destroy the semiconductor or temporarily actuate a overvoltage cutout which may be present. Once the voltage peak is over, the semiconductor switch is again connected so that if the short-circuit is still present a new voltage peak is produced. The filter inserted between the current sensor and the cutout device however, prevents the pulse-like output voltage of the current sensor produced by this oscillation from actuating the cutout device. The absence of a disconnect when necessary can, however, lead to the destruction of the semiconductor switch.

The object of the present invention is to provide assurance in a circuit arrangement of the type in question that a disconnect definitely takes place in the event of a short-circuit even when an inductive component is present. This object is achieved in the circuit arrangement of the invention in the manner that the cutout device furthermore can be actuated via a logic circuit by the switch signal and by an output signal of a detector for an overvoltage on the semiconductor switch in such a manner that disconnection takes place when an overvoltage is present and that the switch signal assumes a level intended for connection.

The circuit arrangement of the invention has the advantage that, with the semiconductor switch connected, overvoltages are recognized as overvoltages caused by a short-circuit with inductive load and lead to immediate disconnect. As compared with the known circuit arrangements, the circuit arrangement of the invention merely requires an additional AND circuit, which means only an extremely small additional expense when it is developed by means of integrated circuits or hybrid circuits.

One advantageous embodiment of the circuit arrangement of the invention consists therein that the logic circuit is an AND circuit when the switch signal for the connecting and the output signal of the overvoltage detector for the event of overvoltage assume the logical level "1".

Another advantageous embodiment is characterized by the fact that between the switch signal and a control electrode of the semiconductor switch a further logic circuit is provided in the signal path by which the feeding of the switch signal to the control electrode is interrupted when the device is actuated for disconnect.

The invention permits of numerous embodiments. Two of them are shown diagrammatically in several figures in the drawing and will be described below. In the drawing.

Identical parts in the figures have been provided with the same reference numerals.

Figure 1:
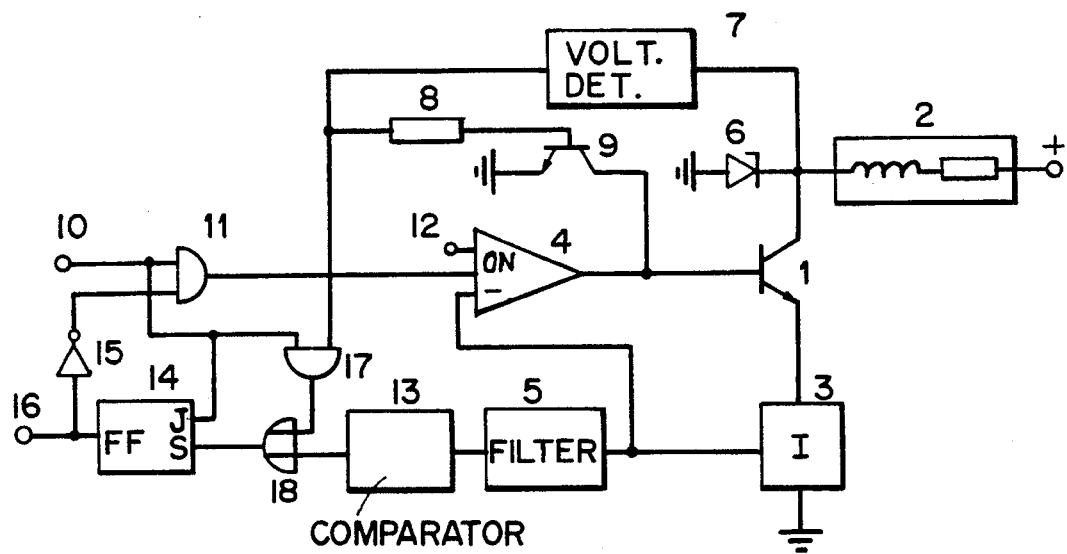
FIG. 1 is a circuit diagram of a first embodiment.

In the circuit arrangement of FIG. 1, the emitter-collector path of a transistor 1 which serves as semiconductor switch is connected in series with a load 2 which is connected to the positive terminal of an operating voltage which is otherwise not shown. In the emitter branch of the transistor there is contained the current sensor 3 which produces a voltage corresponding to the emitter current and applies it to the inverting input of a current limiting controller 4 and to the input of a filter 5. A Z-diode 6 is connected in parallel to the collector-emitter path of the transistor 1 in order to lead away excessively high voltage peaks. Furthermore, an overvoltage detector is connected to the collector of the transistor 1, the output voltage of which assumes the value 1 when the collector voltage exceeds a predetermined value. The output voltage of the overvoltage detector 7 is referred to below as overvoltage signal.

Via a resistor 8 the overvoltage signal brings a further transistor 9 into conductive state as soon as the collector voltage exceeds the predetermined value. In this way, the base of the transistor 1 is emptied, which is a prerequisite for the utilization of the permissible voltage range of the transistor 1.

In order to control the connecting and disconnecting a switch signal is fed to an input 10, the signal assuming, for connection, a positive level with which the logical level "1" is associated in the example. Via an AND circuit 11, the switch signal passes during normal operation to a switch input of the current limiting controller 4 and is forwarded by the latter to the base of the transistor 1. This takes place in the amount necessary for complete conduction provided that the output voltage of the current sensor 3 does not reach a value which causes a limiting of the current. A reference voltage which determines the maximum value of the current is furthermore fed to the current limiting controller 4 via another input 12.

For the disconnecting of the transistor 1 in the event of a short-circuit, the output voltage of the filter 5 is fed to a comparator 13, the output signal of which assumes the logical level "1" when the current exceeds a predetermined limit value. In known circuit arrangements, the output signal of the comparator 13 is fed directly to a disconnect device which consists of a flip-flop 14 and an invertor 15. By a voltage jump of the switch signal at the input 10, the flip-flop 14 is set back if it had been previously set. In the event of a short-circuit, the output signal of the comparator 13 sets the flip-flop 14, so that the output voltage of the flip-flop assumes the logical level "1" and, via the invertor 15 and the AND circuit 11, prevents the feeding of the switch signal to the current limiting controller. Furthermore, a signal for indicating the short-circuit disconnect can be obtained from an output 16.

In order to assure the disconnecting in the event of a load which is inductive also in the event of a short-circuit, the overvoltage signal is fed to an input of another AND circuit 17, the other input of which is acted on by the switch signal. The output of the AND circuit 17 is connected to an input of an OR circuit 18 which furthermore lies in the signal path between the comparator 13 and the set input of the flip-flop 14. During the connect time of the transistor 1, the switch signal at the input 10 has the level "1". If a short-circuit occurs during this time which, due to the inductive component of the short-circuit load, results in a voltage peak, the flip-flop 14 is set, via the AND circuit 17 and the OR circuit 18, by the overvoltage signal which in this case also assumes the level "1", this in its turn, leading to the disconnecting of the transistor via the invertor 15 and the AND circuit 11.

Figure 2:
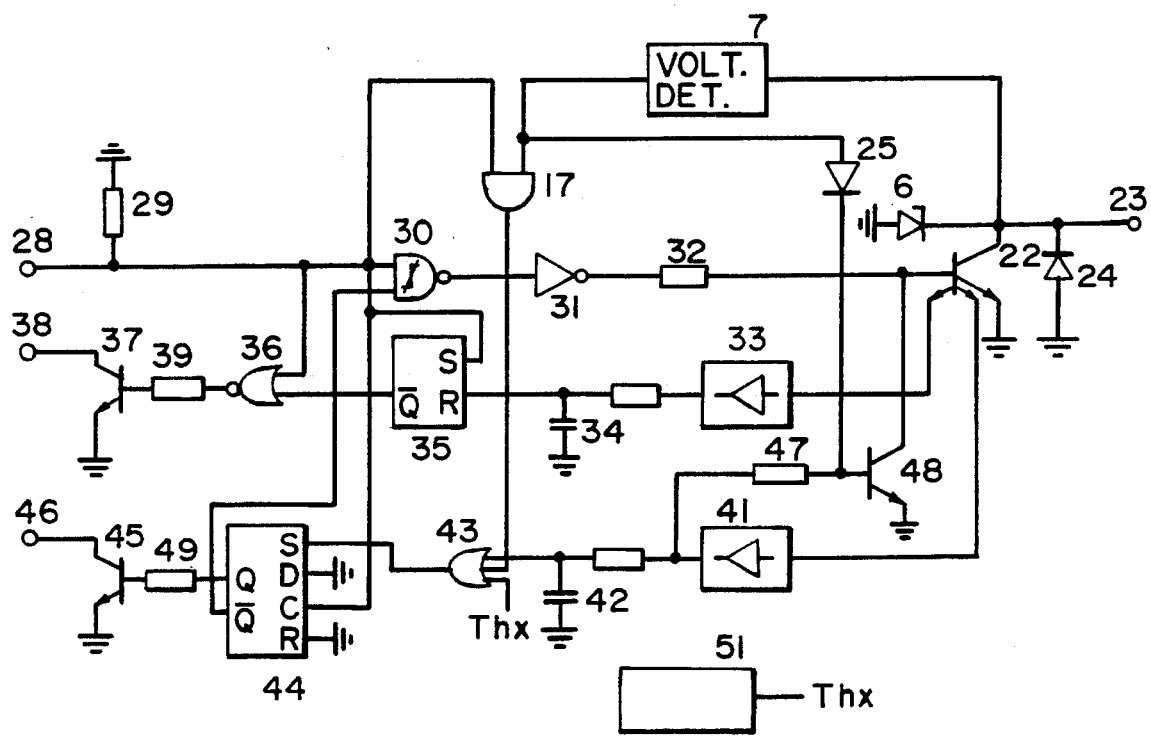
FIG. 2 is a circuit diagram of a second embodiment.

FIG. 2 shows a practical embodiment of a circuit. In this case, the output stage is formed by a multi-emitter transistor 22, one emitter of which is connected to ground and the collector of which is connected to an output 23. Since the circuit arrangement is intended essentially for the connecting of inductive loads, a reverse polarity protection diode 42 and a Z-diode 6 are connected in parallel to the transistor 22 in order to protect the transistor 22 from overvoltages.

A switch signal for the transistor 22 is fed via an input 28 which is connected to ground via an input resistor 29. The switch signal passes via an AND circuit 30, an inverting amplifier 31, and a resistor 32 to the base of the transistor 22.

For the recognition of defects in the region of the output 23, a no-load monitoring circuit and a short-circuit monitoring circuit are provided. The no-load monitoring circuit responds when the current through the transistor 22 is below a predetermined threshold and when, therefore, a break in the line is present between the collector of the transistor 22, the load, within the load, or between the load and the positive operating voltage. The no-load monitoring circuit also responds upon a short-circuit of the output 23 to ground.

The short-circuit monitoring circuit responds when the current through the transistor 22 exceeds another predetermined value, as is substantially the case upon a short-circuit between the output 23 or the line to the load on the one hand, and the positive terminal of the source of operating voltage on the other hand.

The no-load monitoring circuit is formed by a threshold circuit 33, a low-pass filter 34, a flip-flop 35, an OR circuit 36 and an output transistor 37. At an output 38, there can be obtained a signal which indicates no-load and therefore, for instance, a break in the line.

The threshold circuit 33 produces an output signal which is positive when a pre-determined value of the current through the transistor 22 is exceeded. This pre-determined value is below the current to be expected for the load in question, tolerances of the individual loads and variations in time and temperature being taken into account. Brief disturbances are suppressed by the low-pass filter 34 which has, for instance, a time constant of 200 μs.

The flip-flop 35 is set upon the start in each case of a control pulse which brings the transistor 22 into the conductive state. The value L is then present at the output $\overline{Q}$. By the NOR connection 36 to the control signal, which at this time has the value of "1", a signal "0" is produced at the outlet of the NOR circuit, which signal, via the resistor 39, brings the transistor 37 into the non-conductive state. The output 38 is thus imparted the level "1".

If the current increases to above the threshold value during the conductive phase of the transistor 22, the flip-flop 35 is set back. At the end of the conductive phase, the control signal assumes the value "0", so that the signal at the output 38 is dependent on the level at the output $\overline{Q}$ due to the NOR connection. Since the flip-flop 35 has been set back, the level "1" is present at the output $\overline{Q}$, so that the transistor 37 continues to be non-conductive and the level "1" prevails at the output 38.

However, if the current through the transistor 22 has not exceeded the predetermined value during the conductive phase, the flip-flop 35 remains set so that the output $\overline{Q}$ continues to have the level "0". This leads to actuation of the transistor 37 so that the level "0" is indicated as error message at the output 38.

The short-circuit monitoring circuit consists of a threshold circuit 41, a low-pass filter 42, an OR circuit 43, a flip-flop 44, and an output transistor 45 the collector of which forms an output 46. The output signal of the threshold circuit 41 jumps to a positive value when the current through the transistor 22 exceeds a value which lies above the currents to be expected upon normal operation. The low-pass filter 42 serves to suppress brief disturbances. In order to form a current-limiting controller, the base of a transistor 48 is connected to the output of the threshold circuit 41 by a resistor 47 which, with the resistor 32 as operating resistor, reduces the voltage at the base of the transistor in the event of a short circuit and thus effects a limiting of the current. In this way, the current is limited to a value at which the transistor is still not overloaded and which is sufficient to set the flip-flop 44 which is actuated by the control signals. In addition, the transistor 48 can be brought into conductive state by the overvoltage signal via a diode 25 in order to clear the base of the transistor 22.

By the setting of the flip-flop 44, the transistor 45 which is connected to the output $\overline{Q}$ of the flip-flop 44 via a resistor 49 becomes conductive so that the output 46 assumes the level "0" in the event of a short-circuit. At the same time, due to the connection of the output $\overline{Q}$ of the flip-flop 44 to the NOR circuit 30 further feeding of the control signals to the transistor 22 is prevented until the switch signal at the input 28 again changes from level "0" to level "1" and the flip-flop 44 is thus again set back.

Furthermore, a temperature sensor 51 is provided which gives off a signal Thx which assumes the level "1" when a permissible temperature value is exceeded. This signal is fed to the OR circuits 43 and thus produces a short-circuit error report.

As in the case of the circuit arrangement of FIG. 1, the switch signal and the overvoltage signal are fed to an AND circuit 17. The output of the AND circuit 17 is connected to a third input of the OR circuit 43.

I claim:

1. A switch control circuit having a semiconductor switch for switching a load in response to a switch signal, the circuit further comprising:

a current sensor for sensing current in the semiconductor switch, a device for disconnection of said current in the event of a short circuit in the load, and a low-pass filter connecting an output of said sensor to said disconnection device;

a logic circuit having a first input and a second input, and an overvoltage detector for detecting an overvoltage on the semiconductor switch;

wherein said load and said semiconductor switch and said current sensor are serially connected between terminals of a source of power providing for a flow of current through said load and said switch and said sensor;

a junction between the load and the semiconductor switch is connected via said detector directly to said first input of said logic circuit, and said second input of said logic circuit receives said switch signal; and an output of said logic circuit activates said disconnection device to disconnect said current in the presence of said overvoltage and upon said switch signal assuming a connect level for activating said semiconductor switch to connect the load.

2. A switch control circuit according to claim 1, wherein said logic circuit comprises an AND circuit operative in response to said switch signal assuming the connect level and to an output signal of said overvoltage detector indicating the presence of the overvoltage.

3. A switch control circuit according to claim 1, wherein said logic circuit includes a logic element disposed in a signal path between the switch signal and a control electrode of the semiconductor switch for feeding the switch signal to the control electrode, said feeding being interrupted by logic element upon operation of said disconnection device.

4. A switch control circuit according to claim 1, further comprising a transistor circuit directly coupled between an output terminal of said overvoltage detector and a control terminal of said semiconductor switch for termination of current flow in said semiconductor switch upon the occurrence of an overvoltage.

5. A switch control circuit having a semiconductor switch for switching a load in response to a switch signal, the circuit further comprising:

a current sensor for sensing current in the semiconductor switch, a device for disconnection of said current in the event of a short circuit in the load, and a filter connecting an output of said sensor to said disconnection device;

a logic circuit having a first input and a second input, and an overvoltage detector for detecting an overvoltage on the semiconductor switch;

wherein a junction between the load and the semiconductor switch is connected via said detector directly to said first input of said logic circuit, and said second input of said logic circuit receives said switch signal;

an output of said logic circuit activates said disconnection device to disconnect said current in the presence of said overvoltage and upon said switch signal assuming a connect level for activating said semiconductor switch to connect the load; and a transistor circuit directly coupled between an output terminal of said overvoltage detector and a control terminal of said semiconductor switch for termination of current flow in said semiconductor switch upon the occurrence of an overvoltage.

* * * * *